(12) United States Patent
Krah et al.

(10) Patent No.: US 9,444,453 B2
(45) Date of Patent: Sep. 13, 2016

(54) MEASURING BODY CAPACITANCE EFFECT IN TOUCH SENSITIVE DEVICE

(75) Inventors: Christoph Horst Krah, Los Altos, CA (US); Steven Porter Hotelling, San Jose, CA (US); Marduke Yousefpor, San Jose, CA (US)

(73) Assignee: Apple Inc., Cupertino, CA (US)

( * ) Notice: Subject to any disclaimer, the term of this patent is extended or adjusted under 35 U.S.C. 154(b) by 1154 days.

(21) Appl. No.: 12/558,380

(22) Filed: Sep. 11, 2009

(65) Prior Publication Data
US 2011/0061949 A1 Mar. 17, 2011

(51) Int. Cl.
*G06F 3/044* (2006.01)
*H03K 17/96* (2006.01)
*G06F 3/041* (2006.01)

(52) U.S. Cl.
CPC ............ *H03K 17/962* (2013.01); *G06F 3/044* (2013.01); *G06F 3/0418* (2013.01); *G06F 2203/04104* (2013.01); *H03K 2217/960705* (2013.01)

(58) Field of Classification Search
CPC combination set(s) only.
See application file for complete search history.

(56) References Cited

U.S. PATENT DOCUMENTS

| | | | |
|---|---|---|---|
| 5,483,261 A | 1/1996 | Yasutake | |
| 5,488,204 A | 1/1996 | Mead et al. | |
| 5,825,352 A | 10/1998 | Bisset et al. | |
| 5,835,079 A | 11/1998 | Shieh | |
| 5,880,411 A | 3/1999 | Gillespie et al. | |
| 5,880,718 A | 3/1999 | Frindle et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,690,387 B2 | 2/2004 | Zimmerman et al. | |
| 7,015,894 B2 | 3/2006 | Morohoshi | |
| 7,129,714 B2 | 10/2006 | Baxter | |
| 7,184,064 B2 | 2/2007 | Zimmerman et al. | |
| 7,663,607 B2 | 2/2010 | Hotelling et al. | |
| 8,479,122 B2 | 7/2013 | Hotelling et al. | |
| 2006/0026521 A1 | 2/2006 | Hotelling et al. | |
| 2006/0097991 A1 | 5/2006 | Hotelling et al. | |

(Continued)

FOREIGN PATENT DOCUMENTS

JP 2000-163031 A 6/2000
JP 2002-342033 A 11/2002

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

(Continued)

*Primary Examiner* — Van Chow
(74) *Attorney, Agent, or Firm* — Morrison & Foerster LLP

(57) ABSTRACT

Measuring an effect of body capacitance in a touch sensitive device is disclosed. This effect can be caused by poor grounding of a user or other objects touching the device or of the device itself. The device can operate in a stray capacitance mode to measure a body capacitance effect and in a normal mode to detect a touch on the device. During the stray capacitance mode, the device can obtain a body capacitance measurement from the device. During the normal mode, the device can obtain a touch measurement from the device. The device can calculate a body capacitance factor based on a ratio between the body capacitance measurement and the touch measurement and use the body capacitance factor to compensate for erroneous or distorted touch output values from the device. Various components of the device can be switchably configured according to the particular mode.

14 Claims, 15 Drawing Sheets

(56) References Cited

U.S. PATENT DOCUMENTS

| | | |
|---|---|---|
| 2006/0197753 A1 | 9/2006 | Hotelling |
| 2007/0074913 A1 | 4/2007 | Geaghan et al. |
| 2008/0157782 A1 | 7/2008 | Krah |
| 2008/0162751 A1* | 7/2008 | Wilson .......................... 710/52 |
| 2008/0196945 A1 | 8/2008 | Konstas |
| 2009/0160787 A1 | 6/2009 | Westerman et al. |

OTHER PUBLICATIONS

Rubine, D.H. (Dec. 1991). "The Automatic Recognition of Gestures," CMU-CS-91-202, Submitted in Partial Fulfillment of the Requirements for the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

U.S. Appl. No. 12/208,324, filed Sep. 10, 2008, by Yousefpor.

U.S. Appl. No. 12/234,520, filed Sep. 19, 2008, by Yousefpor et al.

* cited by examiner

MEASURING BODY CAPACITANCE EFFECT IN TOUCH SENSITIVE DEVICE

FIELD

This relates generally to touch sensitive devices and, more particularly, to measuring body capacitance affecting touch sensitive devices.

BACKGROUND

Many types of input devices are presently available for performing operations in a computing system, such as buttons or keys, mice, trackballs, joysticks, touch sensor panels, touch screens and the like. Touch sensitive devices, such as touch screens, in particular, are becoming increasingly popular because of their ease and versatility of operation as well as their declining price. A touch sensitive device can include a touch sensor panel, which can be a clear panel with a touch-sensitive surface, and a display device such as a liquid crystal display (LCD) that can be positioned partially or fully behind the panel so that the touch-sensitive surface can cover at least a portion of the viewable area of the display device. The touch sensitive device can allow a user to perform various functions by touching the touch sensor panel using a finger, stylus or other object at a location dictated by a user interface (UI) being displayed by the display device. In general, the touch sensitive device can recognize a touch event and the position of the touch event on the touch sensor panel, and the computing system can then interpret the touch event in accordance with the display appearing at the time of the touch event, and thereafter can perform one or more actions based on the touch event.

When either the object touching at the touch sensor panel or the touch sensitive device itself is poorly grounded, touch output values can be erroneous or otherwise distorted. More specifically, various capacitances, such as the object's body capacitance between the object, e.g., a finger, and ground can distort the capacitances measured at the touch sensor panel, which can be utilized to generate the touch output values. The possibility of such erroneous or distorted values can further increase when two or more simultaneous touch events occur at the touch sensor panel.

SUMMARY

This relates to measuring an effect of body capacitance in a touch sensitive device due to poor grounding of a user or other objects touching the device or of the device itself. The device can operate in a stray capacitance mode to measure a body capacitance effect and in a normal mode to detect a touch on the device. The stray capacitance mode and the normal mode can operate concurrently. In addition or alternatively, the stray capacitance mode and the normal mode can operate separately. During the stray capacitance mode, the device can obtain a body capacitance measurement from the device. During the normal mode, the device can obtain a touch measurement from the device. The device can calculate a body capacitance factor based on a ratio between the body capacitance measurement and the touch measurement and use the body capacitance factor to compensate for erroneous or distorted touch output values from the device. Various components of the device can be configured to switch between the two modes.

DETAILED DESCRIPTION

Figure 1:
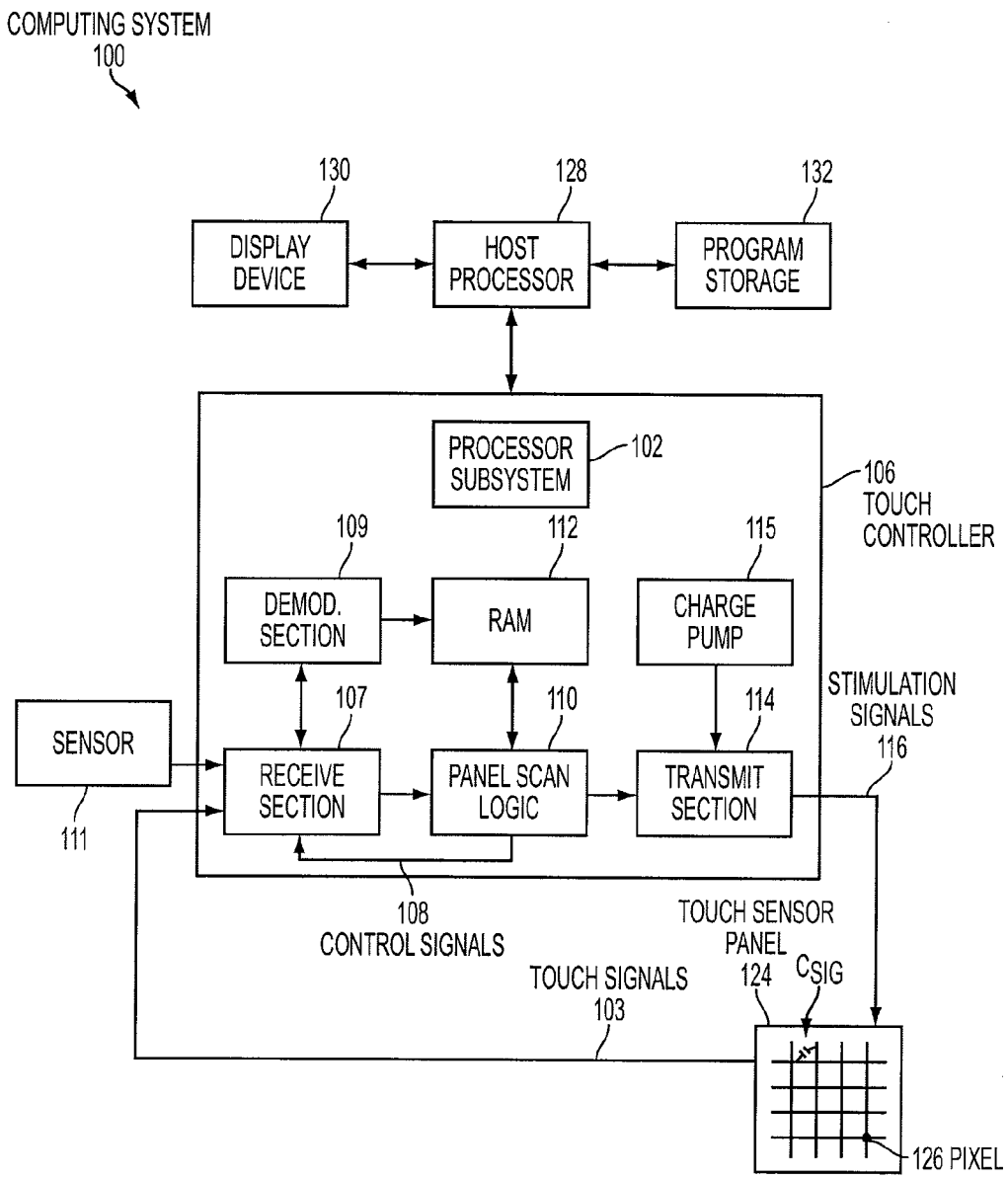
FIG. 1 illustrates an exemplary computing system that can measure an effect of body capacitance according to various embodiments.

In the following description of various embodiments, reference is made to the accompanying drawings which form a part hereof, and in which it is shown by way of illustration specific embodiments which can be practiced. It is to be understood that other embodiments can be used and structural changes can be made without departing from the scope of the various embodiments.

This relates to measuring an effect of body capacitance in a touch sensitive device due to poor grounding of a user or other objects touching the device or of the device itself. The device can operate in a stray capacitance mode to measure a body capacitance effect and in a normal mode to detect a touch on the device. In some embodiments, the two modes can operate concurrently. In some embodiments, the two modes can operate alternately. In some embodiment, one mode can operate multiple times, following by the other mode. During the stray capacitance mode, the device can obtain a body capacitance measurement from the device. During the normal mode, the device can obtain a touch measurement from the device. The device can calculate a body capacitance factor based on a ratio between the body capacitance measurement and the touch measurement and use the body capacitance factor to compensate for erroneous or distorted touch output values from the device. Various components of the device can be switchably configured according to the particular mode.

The ability to measure an effect of body capacitance in a touch sensitive device can advantageously compensate touch output values for unwanted touch artifacts, thereby providing more accurate and faster touch detection by not having to repeat measurement subject to poor grounding conditions. Power savings can also be realized by not having to repeat measurements. Additionally, the device can more robustly adapt to various grounding conditions of a user.

The terms "poorly grounded," "ungrounded," "not grounded," "not well grounded," "improperly grounded," "isolated," and "floating" can be used interchangeably to refer to poor grounding conditions that can exist when an object is not making a low resistance electrical connection to the ground of the touch sensitive device.

The terms "grounded," "properly grounded," and "well grounded" can be used interchangeably to refer to good grounding conditions that can exist when an object is making a low resistance electrical connection to the ground of the touch sensitive device.

Although various embodiments can be described and illustrated herein in terms of mutual capacitance touch sensor panels, it should be understood that the various embodiments are not so limited, but can be additionally applicable to self-capacitance sensor panels, and both single and multi-touch sensor panels, and other sensors, in which single stimulation signals can be used to generate a touch signal and in which multiple simultaneous stimulation signals can be used to generate a composite touch signal. Furthermore, although various embodiments can be described and illustrated herein in terms of double-sided ITO (DITO) touch sensor panels, it should be understood that the various embodiments can be also applicable to other touch sensor panel configurations, such as configurations in which the drive and sense lines can be formed on different substrates or on the back of a cover glass, and configurations in which the drive and sense lines can be formed on the same side of a single substrate.

FIG. 1 illustrates an exemplary computing system 100 that can measure an effect of body capacitance according to various embodiments described herein. In the example of FIG. 1, computing system 100 can include touch controller 106. The touch controller 106 can be a single application specific integrated circuit (ASIC) that can include one or more processor subsystems 102, which can include one or more main processors, such as ARM968 processors or other processors with similar functionality and capabilities. However, in other embodiments, the processor functionality can be implemented instead by dedicated logic, such as a state machine. The processor subsystems 102 can also include peripherals (not shown) such as random access memory (RAM) or other types of memory or storage, watchdog timers and the like. The touch controller 106 can also include receive section 107 for receiving signals, such as touch signals 103 of one or more sense channels (not shown), other signals from other sensors such as sensor 111, etc. The touch controller 106 can also include demodulation section 109 such as a multistage vector demodulation engine, panel scan logic 110, and transmit section 114 for transmitting stimulation signals 116 to touch sensor panel 124 to drive the panel. The panel scan logic 110 can access RAM 112, autonomously read data from the sense channels, and provide control for the sense channels. In addition, the panel scan logic 110 can control the transmit section 114 to generate the stimulation signals 116 at various frequencies and phases that can be selectively applied to rows of the touch sensor panel 124.

The touch controller 106 can also include charge pump 115, which can be used to generate the supply voltage for the transmit section 114. The stimulation signals 116 can have amplitudes higher than the maximum voltage by cascading two charge store devices, e.g., capacitors, together to form the charge pump 115. Therefore, the stimulus voltage can be higher (e.g., 6V) than the voltage level a single capacitor can handle (e.g., 3.6 V). Although FIG. 1 shows the charge pump 115 separate from the transmit section 114, the charge pump can be part of the transmit section.

Touch sensor panel 124 can include a capacitive sensing medium having row traces (e.g., drive lines) and column traces (e.g., sense lines), although other sensing media can also be used. The row and column traces can be formed from a transparent conductive medium such as Indium Tin Oxide (ITO) or Antimony Tin Oxide (ATO), although other transparent and non-transparent materials such as copper can also be used. In some embodiments, the row and column traces can be perpendicular to each other, although in other embodiments other non-Cartesian orientations are possible. For example, in a polar coordinate system, the sense lines can be concentric circles and the drive lines can be radially extending lines (or vice versa). It should be understood, therefore, that the terms "row" and "column" as used herein are intended to encompass not only orthogonal grids, but the intersecting traces of other geometric configurations having first and second dimensions (e.g. the concentric and radial lines of a polar-coordinate arrangement). The rows and columns can be formed on, for example, a single side of a substantially transparent substrate separated by a substantially transparent dielectric material, on opposite sides of the substrate, on two separate substrates separated by the dielectric material, etc.

At the "intersections" of the traces, where the traces pass above and below (cross) each other (but do not make direct electrical contact with each other), the traces can essentially form two electrodes (although more than two traces can intersect as well). Each intersection of row and column traces can represent a capacitive sensing node and can be viewed as picture element (pixel) 126, which can be particularly useful when the touch sensor panel 124 is viewed as capturing an "image" of touch. (In other words, after the touch controller 106 has determined whether a touch event has been detected at each touch sensor in the touch sensor panel, the pattern of touch sensors in the multi-touch panel at which a touch event occurred can be viewed as an "image" of touch (e.g. a pattern of fingers touching the panel).) The capacitance between row and column electrodes can appear as a stray capacitance Cstray when the given row is held at direct current (DC) voltage levels and as a mutual signal capacitance Csig when the given row is stimulated with an alternating current (AC) signal. The presence of a finger or other object near or on the touch sensor panel can be detected by measuring changes to a signal charge Qsig present at the pixels being touched, which can be a function of Csig. The signal change Qsig can also be a function of a capacitance Cbody of the finger or other object to ground, as will be described in more detail later.

Computing system 100 can also include host processor 128 for receiving outputs from the processor subsystems 102 and performing actions based on the outputs that can include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. The host processor 128 can also perform additional functions that may not be related to panel processing, and can be coupled to program storage 132 and display device 130 such as an LCD display for providing a UI to a user of the device. In some embodiments, the host processor 128 can be a separate component from the touch controller 106, as shown. In other embodiments, the host processor 128 can be included as part of the touch controller 106. In still other embodiments, the functions of the host processor 128 can be performed by the processor subsystem 102 and/or distributed among other components of the touch controller 106. The display device 130 together with the touch sensor panel 124, when located partially or entirely under the touch sensor panel or when integrated with the touch sensor panel, can form a touch sensitive device such as a touch screen.

A body capacitance effect can be determined by the processor in subsystem 102, the host processor 128, dedicated logic such as a state machine, or any combination thereof according to various embodiments.

Note that one or more of the functions described above can be performed, for example, by firmware stored in memory (e.g., one of the peripherals) and executed by the processor subsystem 102, or stored in the program storage 132 and executed by the host processor 128. The firmware can also be stored and/or transported within any computer readable storage medium for use by or in connection with an instruction execution system, apparatus, or device, such as a computer-based system, processor-containing system, or other system that can fetch the instructions from the instruction execution system, apparatus, or device and execute the instructions. In the context of this document, a "computer readable storage medium" can be any medium that can contain or store the program for use by or in connection with the instruction execution system, apparatus, or device. The computer readable storage medium can include, but is not limited to, an electronic, magnetic, optical, electromagnetic, infrared, or semiconductor system, apparatus or device, a portable computer diskette (magnetic), a random access memory (RAM) (magnetic), a read-only memory (ROM) (magnetic), an erasable programmable read-only memory (EPROM) (magnetic), a portable optical disc such a CD, CD-R, CD-RW, DVD, DVD-R, or DVD-RW, or flash memory such as compact flash cards, secured digital cards, USB memory devices, memory sticks, and the like.

The firmware can also be propagated within any transport medium for use by or in connection with an instruction execution system, apparatus, or device, such as a computer-based system, processor-containing system, or other system that can fetch the instructions from the instruction execution system, apparatus, or device and execute the instructions. In the context of this document, a "transport medium" can be any medium that can communicate, propagate or transport the program for use by or in connection with the instruction execution system, apparatus, or device. The transport medium can include, but is not limited to, an electronic, magnetic, optical, electromagnetic or infrared wired or wireless propagation medium.

It is to be understood that the touch sensor panel is not limited to touch, as described in FIG. 1, but can be a proximity panel or any other panel according to various embodiments. In addition, the touch sensor panel described herein can be either a single-touch or a multi-touch sensor panel.

It is further to be understood that the computing system is not limited to the components and configuration of FIG. 1, but can include other and/or additional components in various configurations capable of measuring an effect of body capacitance according to various embodiments.

Figure 2:
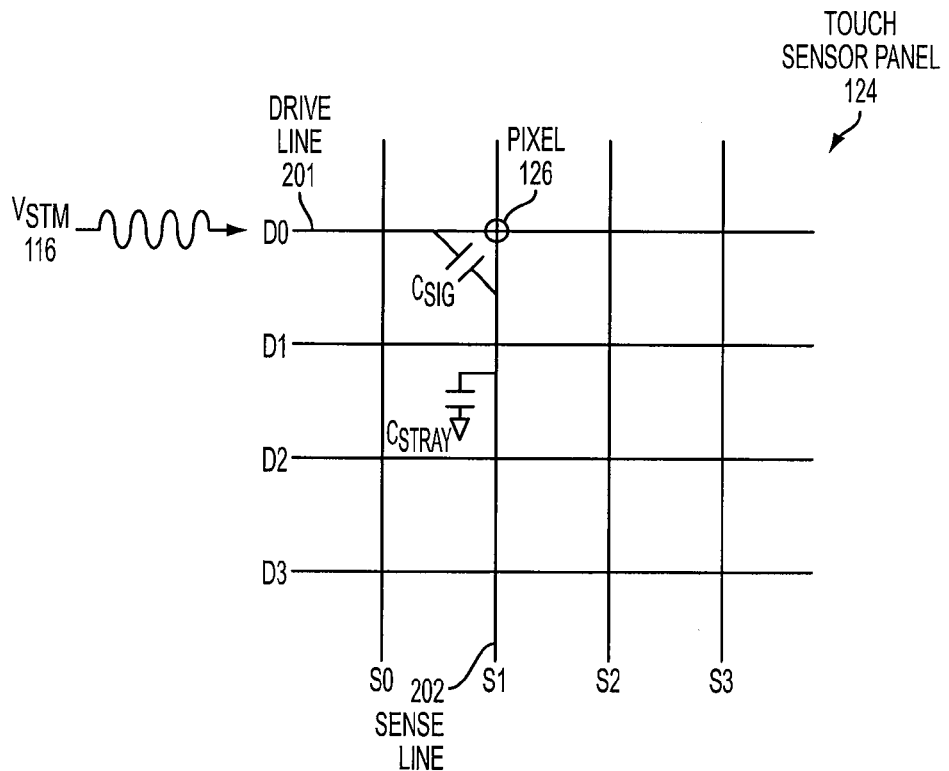
FIG. 2 illustrates an exemplary touch sensor panel in a no-touch condition according to various embodiments.

FIG. 2 illustrates an exemplary touch sensor panel in a no-touch condition, i.e., where there are no present touches at the panel, according to various embodiments. In the example of FIG. 2, touch sensor panel 124 can include an array of pixels 126 that can be formed at the crossings of rows of drive lines 201 (D0-D3) and columns of sense lines 202 (S0-S3). Each pixel 126 can have an associated mutual capacitance Csig when the drive line 201 forming the pixel is stimulated with a stimulation signal Vstm 116. Each pixel 126 can also have an associated stray capacitance Cstray when the drive line 201 forming the pixel is not stimulated with a stimulation signal Vstm 116 but is connected to DC. In this example, drive line D0 can be stimulated with stimulation signal 116 (Vstm), forming mutual capacitance Csig at the pixels 126 formed between the drive line D0 and the crossing sense lines S0-S3.

Figure 3:
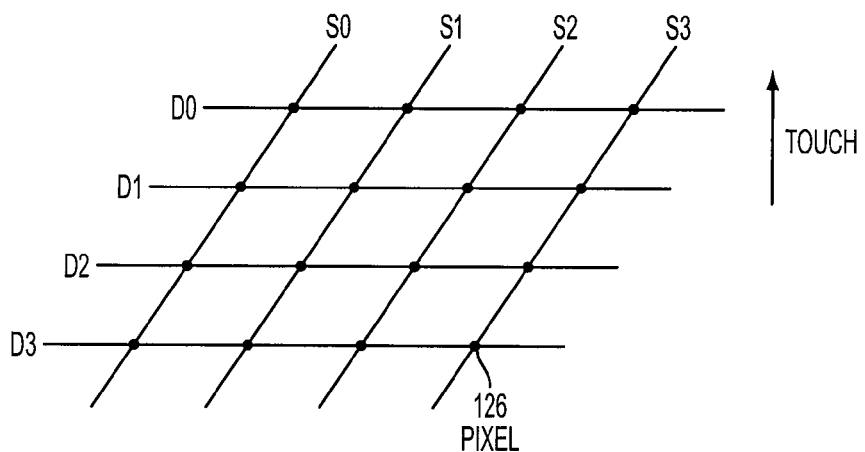
FIG. 3 illustrates an exemplary touch map of a touch sensor panel in a no-touch condition according to various embodiments.

FIG. 3 illustrates an exemplary touch map of a touch sensor panel in a no-touch condition according to various embodiments. In the example of FIG. 3, drive lines D0-D3 of touch sensor panel 124 can be individually and/or simultaneously stimulated with stimulation signal(s) Vstm 116. Since there are no fingers touching at the pixels 126 formed by the drive lines D0-D3 and the crossing sense lines S0-S3, the fingers cannot block some of the electric field lines formed when the drive lines are stimulated so as to reduce the mutual capacitance Csig by an amount ΔCsig. As such, the touch map can remain substantially flat at the pixels 126 to indicate no touch.

Figure 4:
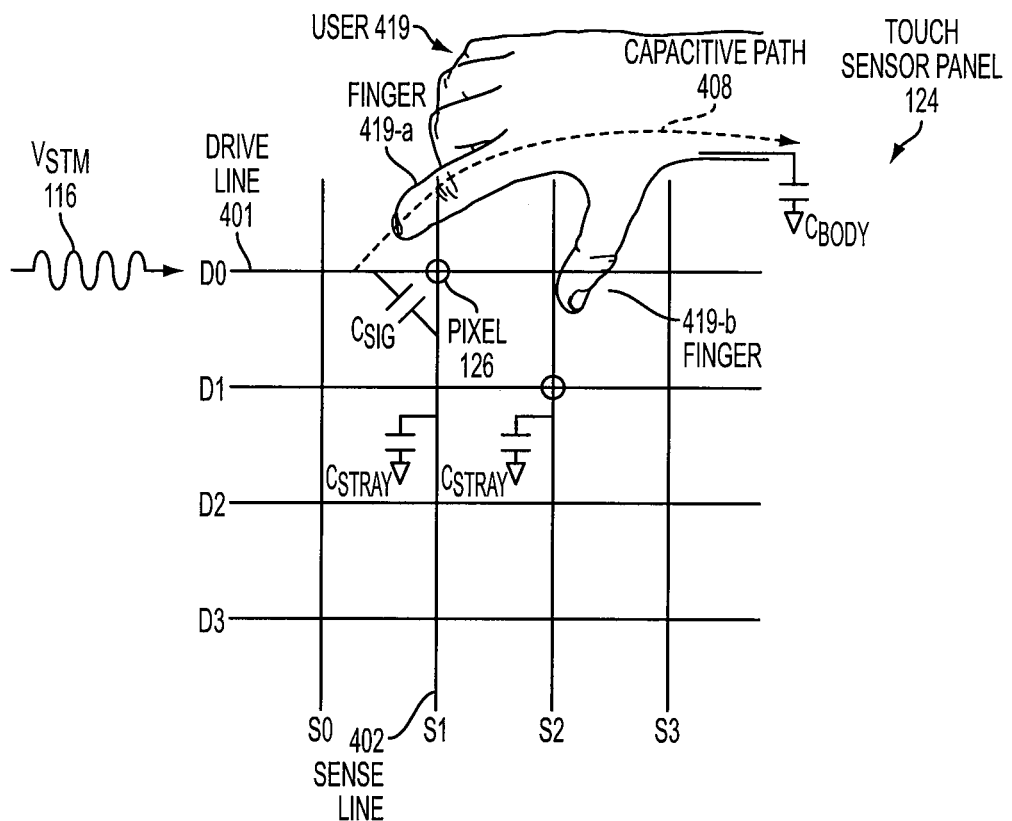
FIG. 4 illustrates an exemplary touch sensor panel at which there are multiple touches from a well grounded user according to various embodiments.

FIG. 4 illustrates an exemplary touch sensor panel at which there are presently multiple touches from a well grounded user according to various embodiments. In the example of FIG. 4, one of drive lines 401 (D0) of touch sensor panel 124 can be stimulated with a stimulation signal 116 (Vstm) to form a mutual capacitance Csig between the stimulated drive line D0 and the crossing sense lines 402 (S0-S3). In this example, user 419 can touch with finger 419-$a$ at pixel 126 formed by drive line D0 and sense line S1

("pixel D0,S1") and with finger 419-*b* at pixel 126 formed by drive line D1 and sense line S2 ("pixel D1,S2"). The user's body can have a capacitance Cbody to ground, e.g., about 200 pF in some embodiments. When the user's finger 419-*a* touches at the touch sensor panel 124, the finger can block some of the electric field lines formed when the drive line D0 is stimulated and those electric field lines can be shunted to ground through the capacitance path 408 from the finger through the body to ground. As a result, the mutual capacitance Csig at pixel D0,S1 can be reduced by ΔCsig. In this example, since drive line D1 is not being stimulated with Vstm while D0 is being stimulated, the finger 419-*b* at pixel D1,S2 cannot affect the pixel's capacitance.

Similar to the finger 419-*a*, when drive line D1 is stimulated with Vstm, the finger 419-*b* can reduce the mutual capacitance Csig by ΔCsig at pixel D1,S2. In this example, since drive line D0 is not being stimulated with Vstm while D1 is being stimulated, the finger 419-*a* at pixel D0,S1 cannot affect the pixel's capacitance.

Figure 5:
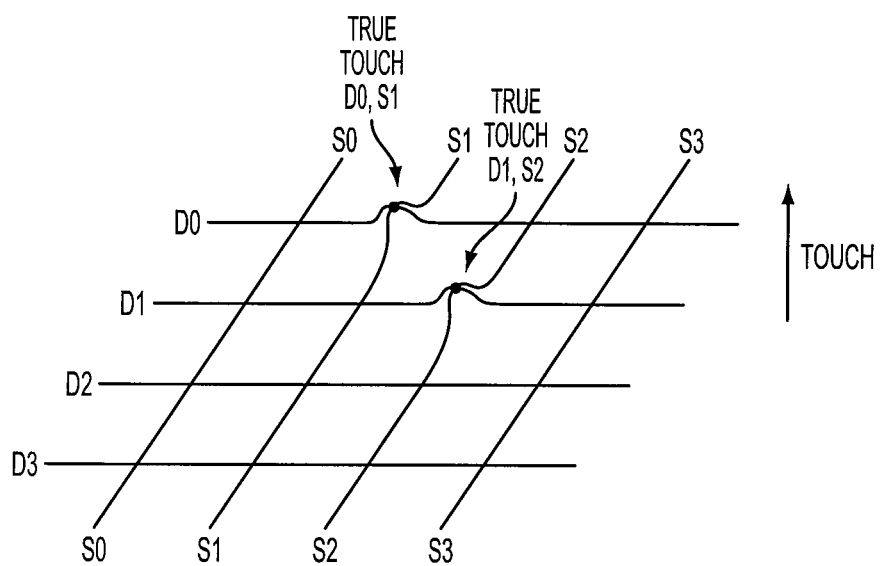
FIG. 5 illustrates an exemplary touch map of a touch sensor panel at which there are multiple touches from a well grounded user according to various embodiments.

FIG. 5 illustrates an exemplary touch map of a touch sensor panel at which there are presently multiple touches from a well grounded user according to various embodiments. In the example of FIG. 5, drive lines D0-D3 of touch sensor panel 124 can be individually and/or simultaneously stimulated with stimulation signal(s) Vstm 116. User 419 can touch with finger 419-*a* at pixel D0,S1 and with finger 419-*b* at pixel D1,S2, as in FIG. 4. When drive line D0 is stimulated with Vstm, the finger 419-*a* at pixel D0,S1 can block some of the electric field lines formed during the stimulation, thereby reducing Csig by ΔCsig at pixel D0,S1. As such, the touch map can indicate a true touch of the finger 419-*a* at pixel D0,S1 (symbolically illustrated by a peak) when drive line D0 is stimulated. Similarly, when drive line D1 is stimulated with Vstm, the finger 419-*b* at pixel D1,S2 can block some of the electric field lines formed during the stimulation, thereby reducing Csig by ΔCsig at pixel D1,S2. As such, the touch map can indicate a true touch of the finger 419-*b* at pixel D1,S2 (symbolically illustrated by a peak) when drive line D1 is stimulated.

The touch map in this example indicates the touches when both drive lines D0 and D1 are stimulated. However, in the case where only drive line D0 is stimulated, the touch map can indicate a touch of the finger 419-*a* at pixel D0,S1, but not a touch of the finger 419-*b* at pixel D1,S2. Conversely, in the case where only drive line D1 is stimulated, the touch map can indicate a touch of the finger 419-*b* at pixel D1,S2, but not a touch of the finger 419-*a* at pixel D0,S1.

Figure 6:
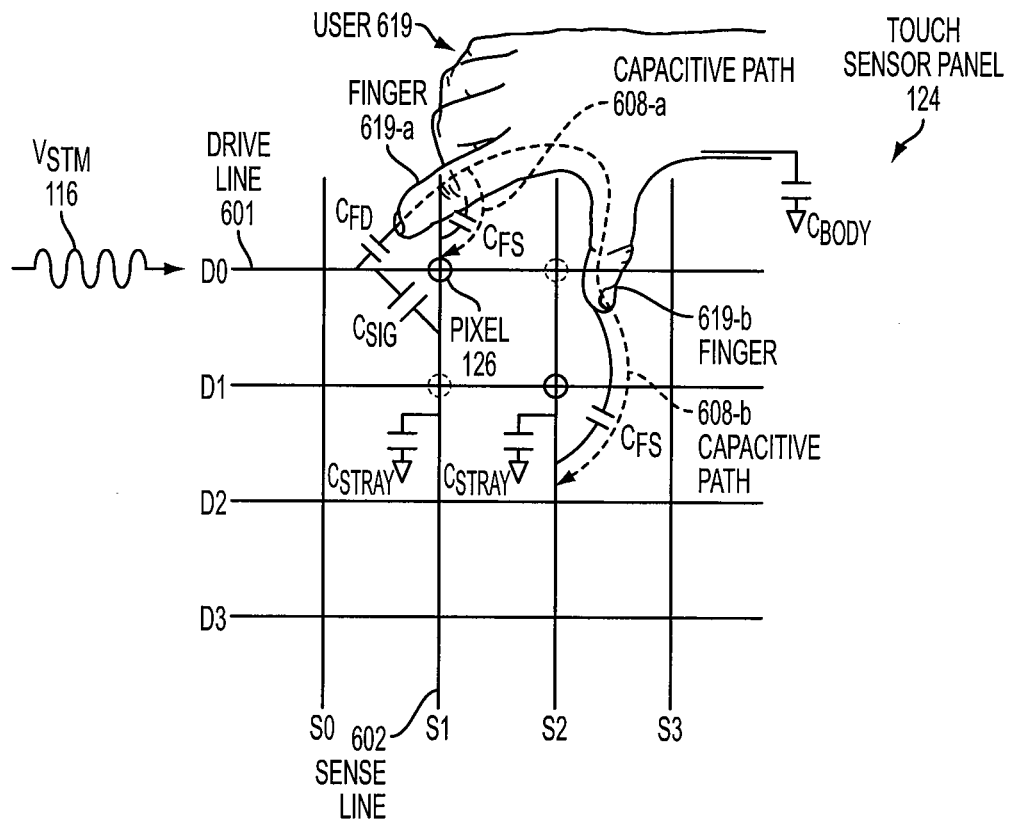
FIG. 6 illustrates an exemplary touch sensor panel at which there are multiple touches from a poorly grounded user according to various embodiments.

FIG. 6 illustrates an exemplary touch sensor panel at which there are multiple touches from a poorly grounded user according to various embodiments. In the example of FIG. 6, one of drive lines 601 (D0) of touch sensor panel 124 can be stimulated with a stimulation signal 116 (Vstm) to form a mutual capacitance Csig between the stimulated drive line D0 and the crossing sense lines 602 (S0-S3). In this example, user 619 can touch with finger 619-*a* at pixel 126 formed by drive line D0 and sense line S1 ("pixel D0,S1") and with finger 619-*b* at pixel 126 formed by drive line D1 and sense line S2 ("pixel D1,S2"). Because the user 619 is poorly grounded, the user's body capacitance Cbody to ground can vary significantly, e.g., between 10-100 pF in some embodiments. The user's finger 619-*a* can also form a capacitance Cfd from the stimulated drive line D0 to that finger. When the finger 419-*a* touches at the touch sensor panel 124, the finger can block some of the electric field lines formed when the drive line D0 is stimulated. But instead of those electric field lines being shunted to ground, a capacitance Cfs from the finger 619-*a* to the sense line S1 can form, sending some of the charge from the electric field lines through capacitive path 608-*a* from the finger to the sense line S1. As a result, instead of the mutual capacitance Csig at pixel D0,S1 being reduced by ΔCsig, Csig can only be reduced by (ΔCsig−Cneg), where Cneg can represent a so-called "negative capacitance" resulting from the charge sent into sense line S1 due to the poor grounding of the user 419. Negative capacitance will be described in more detail below.

Similarly, a capacitance Cfs from the finger 619-*b* to the sense line S2 can also form, sending some of the charge from the electric field lines through capacitive path 608-*b* from the finger to the sense line S2. As a result, though drive line D1 is not being stimulated with Vstm while drive line D0 is being stimulated, the finger 619-*b* at pixel D1,S2 can increase the pixel's capacitance by Cneg (a negative capacitance at the pixel resulting from the charge sent into sense line S2 due to the poor grounding of the user) to a capacitance above that of no touch to give the appearance of a so-called "negative pixel" or a theoretical negative amount of touch at pixel D1,S2.

Adjacent pixels can also experience this negative pixel effect. The pixel 126 formed by the drive line D0 and the crossing sense line S2 ("pixel D0,S2") can increase the pixel's capacitance Csig by Cneg, due to the capacitance Cfs introduced by the finger 619-*b* into the sense line S2. Similarly, the pixel 126 formed by the drive line D1 and the crossing sense line S1 ("pixel D1,S1") can increase the pixel's capacitance by Cneg to a capacitance above that of no touch, due to the capacitance Cfs introduced by the finger 619-*a* into the sense line S1.

Similar to the finger 619-*a*, when drive line D1 is stimulated with Vstm, the finger 619-*b* can reduce the mutual capacitance Csig by (ΔCsig−Cneg) at pixel D1,S2, where Cneg can be a negative capacitance at the pixel resulting from the charge from the electric field lines sent into sense line S2 when drive line D1 is stimulated. In this example, since drive line D0 is not stimulated while drive line D1 is stimulated, the finger 619-*a* at pixel D0,S1 can increase the pixel's capacitance by Cneg to give the appearance of a negative pixel. Adjacent pixels D1,S2 and D0,S1 can similarly experience the negative pixel effect.

Figure 7:
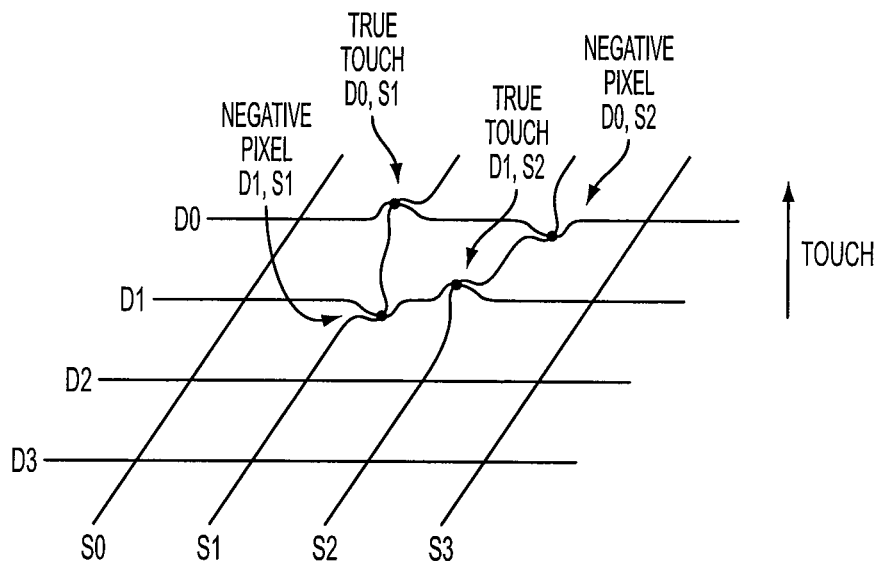
FIG. 7 illustrates an exemplary touch map of a touch sensor panel at which there are multiple touches from a poorly grounded user according to various embodiments.

FIG. 7 illustrates an exemplary touch map of a touch sensor panel where there are presently multiple touches from a poorly grounded user according to various embodiments. In the example of FIG. 7, drive lines D0-D3 of touch sensor panel 124 can be individually and/or simultaneously stimulated with stimulation signal(s) Vstm 116. User 619 can touch with finger 619-*a* at pixel D0,S1 and with finger 619-*b* at pixel D1,S2, as in FIG. 6. When drive line D0 is stimulated, the finger 619-*a* at pixel D0,S1 can shunt some of the blocked electric field lines into the sense line S1 instead of into ground, such that the touch map can indicate an attenuated true touch at that pixel (symbolically illustrated by a slight peak). Similarly, when drive line D1 is stimulated, the finger 619-*b* at pixel D1,S2 can shunt some of the blocked electric field lines into the sense line S2 instead of into ground, such that the touch map can indicate an attenuated true touch at that pixel (symbolically illustrated by a slight peak). Adjacent pixels D1,S1 and D0,S2 can experience a negative pixel effect, as described previously, such that the touch map can indicate a negative touch at these pixels (symbolically illustrated by hollows). The net result of the user being poorly grounded can be that the touch signal of the pixel being touched can be attenuated and the adjacent pixels can experience a negative pixel effect.

The touch map in this example indicates the touches when both drive lines D0 and D1 are stimulated. However, in the case where only drive line D0 is stimulated, the touch map can indicate an attenuated touch of the finger 619-*a* at pixel D0,S1 and negative touches of various magnitudes of the finger 619-*b* at pixel D1,S2 and at adjacent no-touch pixels D1,S1 and D0,S2. Conversely, in the case where only drive line D1 is stimulated, the touch map can indicate an attenuated touch of the finger 619-*b* at pixel D1,S2 and negative touches of various magnitudes of the finger 619-*a* at pixel D0,S1 and at adjacent no-touch pixels D1,S1 and D0,S2.

As previously described, negative capacitance can distort pixel touch output values. The extent to which negative capacitance occurs can be a function of the extent to which the user is grounded, which can be reflected in the user's body capacitance Cbody. As such, measuring an effect of the body capacitance and compensating for the negative pixel effect based on that measurement can eliminate or at least attenuate distortion in the pixel touch output values.

In a no-touch condition as illustrated in FIG. 2, for example, the resulting pixel touch output value Vout at the output of a transimpedence amplifier (such as amplifier 809 in FIG. 8) of a sense channel can be a function of Vstm, the stimulation signal to the drive line crossing the sense line outputting to the transimpedence amplifier; Csig, the mutual capacitance between the drive line and the sense line; Rfb, the resistance of the transimpedence amplifier's feedback resistor; and the stimulation signal frequency, for example.

When a well grounded object, such as a user's finger, touches at the touch sensor panel as illustrated in FIG. 4, for example, the mutual capacitance Csig can be decreased by ΔCsig and the no-touch pixel output value Vout can be reduced by Vs. When a poorly grounded object, such as a user's finger, touches at the touch sensor panel as illustrated in FIG. 6, for example, undesirable charge coupling called negative capacitance Cneg can be introduced into the panel. The negative capacitance Cneg can include a finger to drive line capacitance Cfd in series with a finger to sense line capacitance Cfs. There can also be a ground capacitance Cgnd, which can be a function of the device capacitance Cd and the user's body capacitance Cbody and can be expressed as the parallel sum of the capacitance Cbody between the user's body and ground and the capacitance Cd between the device chassis and ground. The negative capacitance Cneg can be equivalent to the combination of Cfd, Cfs, and Cgnd.

When an object is well grounded, Cgnd can be a large value relative to Cfd and Cfs, such that Cneg can be negligible. Additionally, any Cfd can have the positive effect of increasing the drive current in the drive line being stimulated and any Cfs can have the positive effect of being shunted by the virtual ground of the transimpedence amplifier.

In contrast, when an object is poorly grounded, Cfs, Cfd, and Cgnd can be on the same order of magnitude. The negative capacitance can cause the voltage detected by the transimpedence amplifier to be higher by an amount Vn than under well grounded conditions. The resulting pixel touch output value Vout" can be the no-touch pixel output value Vout reduced by Vs and increased by Vn. The negative capacitance effect (or body capacitance effect) on the actual pixel touch output value can be in the opposite direction of the intended touch capacitance change. As such, a pixel experiencing touch under poor grounding conditions can detect less of a touch than is actually present.

Figure 8:
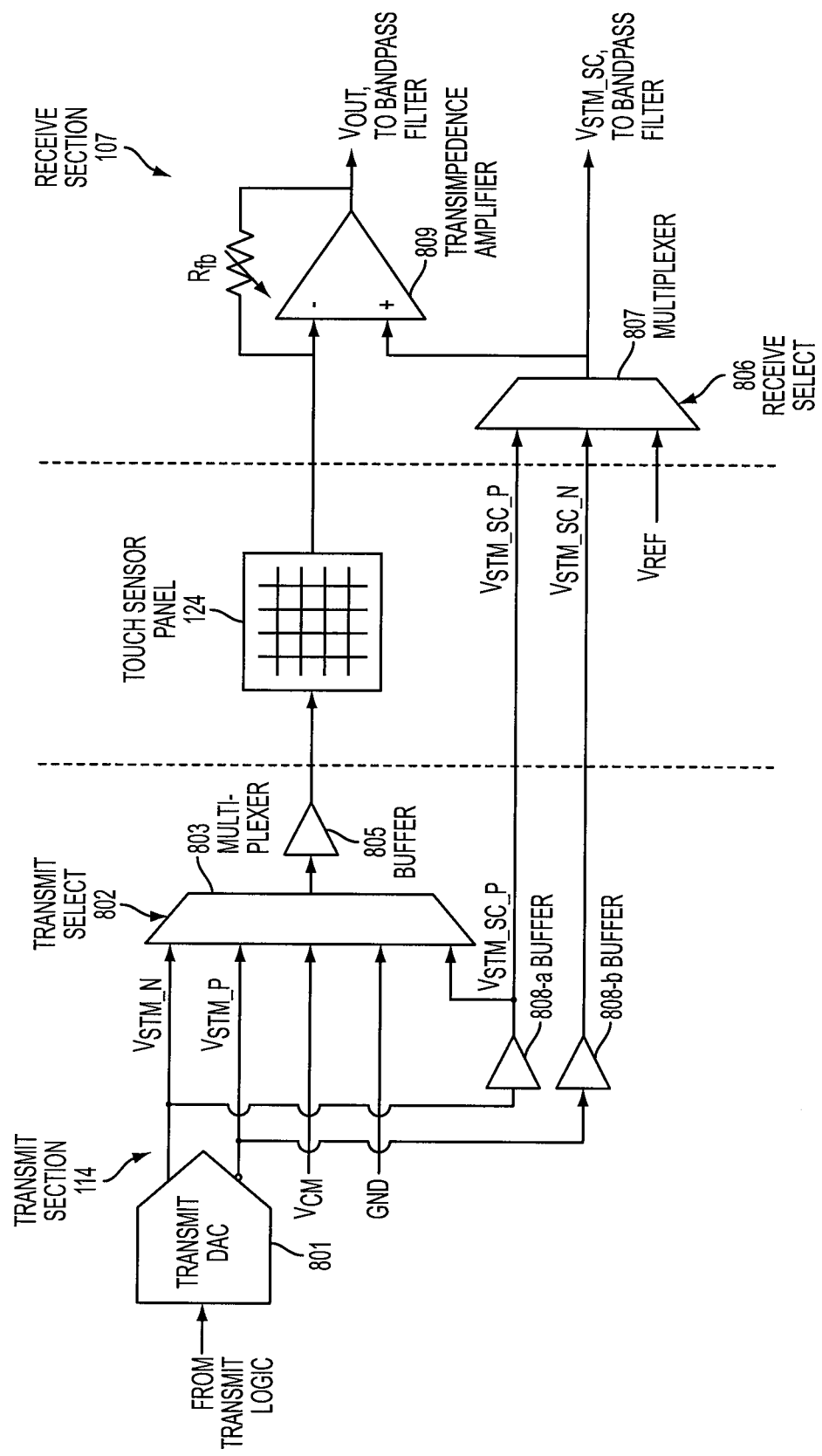
FIG. 8 illustrates an exemplary circuit that can measure an effect of body capacitance according to various embodiments.

FIG. 8 illustrates an exemplary circuit that can measure an effect of body capacitance according to various embodiments. In the example of FIG. 8, touch sensitive device circuit 800 can operate in a normal mode, during which the circuit can detect a capacitive touch at the device, and in a stray capacitance mode, during which the circuit can detect a body capacitance effect in the device. The circuit 800 can include transmit section 114, touch sensor panel 124, and receive section 107. FIG. 8 shows the details of one drive channel of the transmit section 114 and one sense channel of the receive section 107. However, it is to be understood that multiple drive channels and sense channels having similar components can be used.

The transmit section 114 can include transmit digital-to-analog converter (DAC) 801. The transmit DAC 801 can convert digital signals from transmit logic into stimulation signals Vstm_p and Vstm_n to supply to the drive channels. Vstm_p can be a positive (+) phase signal. Vstm_n can be a negative (−) phase signal, inverted relative to Vstm_p about a common voltage Vcm. Vstm_p and Vstm_n can have variable amplitude and can have sinusoidal or other wave shapes (e.g., ramped square wave, etc.). Stimulation signal Vstm_sc_p, a positive (+) phase signal, can also supply the drive channels in stray capacitance mode. Vstm_sc_p can be scaled from Vstm_n and generated via buffer 808-*a*. In some embodiments, stimulation signal Vstm_sc_n, a negative (−) phase signal inverted relative to Vstm_sc_p, can also supply the drive channels in stray capacitance mode. Vstm_sc_n can be scaled from Vstm_p and generated via buffer 808-*b*. The transmit section 114 can also connect the drive channels to Vcm or to ground (gnd). A drive channel of the transmit section 114 can include multiplexer 803 and output buffer 805. The multiplexer 803 of the drive channel can select one of the drive signals, Vstm_p, Vstm_n, Vstm_sc_p, Vstm_sc_n, Vcm, or gnd, to supply the corresponding buffer 805. The multiplexer 803 can select the drive signal based on transmit select signal 802. When the circuit is in normal mode, the select signal 802 can select any of the drive signals, depending on the particular stimulation pattern to be applied to the touch sensor panel 124 to stimulate the drive lines for touch or near touch detection. When the circuit is in stray capacitance mode, the select signal 802 can select any of the drive signals, depending on the particular manner in which the body capacitance effect is measured, as will be described in more detail below. The buffer 805 of the drive channel can increase the gain of the signal from the transmit DAC 801 and provide the drive capability to drive the mostly capacitive load presented to the buffer 805 by the touch sensor panel.

A sense channel of the receive section 107 can include receive multiplexer 807 and transimpedence amplifier 809. Other amplifiers can also be used, e.g., a charge amplifier. The transimpedence amplifier 809 can convert the touch signal current from the touch sensor panel 124 into a voltage signal. The voltage signal can be fed to other components for further processing. The multiplexer 807 can select either a reference voltage Vref or a stimulation signal Vstm_sc_p or Vstm_sc_n to be fed to the non-inverting input of the amplifier 809 in order to convert the touch signal to a voltage. The multiplexer 807 can select the non-inverting input based on receive select signal 806. When the circuit is in normal mode, the select signal 806 can select Vref for processing touch signals to indicate a touch event. When the circuit is in stray capacitance mode, the select signal 806 can select Vstm_sc_p or Vstm_sc_n for measuring an effect of body capacitance to correct for poor grounding conditions.

In some embodiments, in stray capacitance mode, Vstm_sc_p or Vstm_sc_n from the multiplexer 807 can be transmitted to other components, e.g., to a downstream bandpass filter, to improve the dynamic range at the output of the transimpedence amplifier 809. When either stimulation signal Vstm_sc_p or Vstm_sc_n supplies the non-inverting input of the transimpedence amplifier 809, the output voltage of the amplifier can become a function of the stray capacitance Cstray coupled to the inverting input of the amplifier, such that the stimulation signal Vstm_sc appears at the inverting input as the amplifier tries to maintain equilibrium at both inverting and non-inverting inputs. Cstray can represent the sum of all the mutual capacitances Csig on that particular channel and any parasitic capacitances to ground Cgnd. The gain Gtia_sc of the amplifier 809 in stray capacitance mode can be, for example, $$G_{TIA\_SC} = \sqrt{1+(\omega_{STM} \cdot R_{fb} \cdot C_{STRAY})^2}, \quad (1)$$

where ωstm is the stimulation frequency of Vstm_sc in radians and Rfb is the feedback resistance. The "1" term under the square root in Equation (1) can be undesirable as not providing any information about the actual signal out of the amplifier and as limiting the amplifier's dynamic output range by about 6 dB or more, depending on the stimulation frequency. By removing, e.g., subtracting, the stimulation signal Vstm_sc from the output of the amplifier 809, the undesirable "1" term can be removed, such that the gain Gtia_sc can become, for example, $$G_{TIA\_SC} = \omega_{STM} \cdot R_{fb} \cdot C_{STRAY}. \quad (2)$$

In some embodiments, the removal of the stimulation signal Vstm_sc can be effected by transmitting the stimulation signal Vstm_sc from the multiplexer 807 to a downstream bandpass filter (or some other processing component) as a reference signal.

In addition to gaining dynamic range, removing the stimulation signal Vstm_sc from the output of the amplifier 809 can further result in the phase shift between the stimulation signal Vstm_sc and the amplifier output voltage Vout being approximately constant. For example, the phase shift can become approximate π/2. As such, the dependency of the amplifier 809 on the stimulation signal frequency-dependent phase shift can be reduced.

The touch sensor panel 124 can receive stimulation signals from the transmit section 114 and can output touch signals to the receive section 107 in both modes.

The body capacitance effect can be approximately expressed in terms of the relationship between the measured touch output value ΔCsig,m and the actual touch output value ΔCsig,a at a pixel as follows, $$\Delta C_{sig,a}(i,j) = \Delta C_{sig,m}(i,j) + \frac{\sum_{all\_j} C_{fd}(i,j) \times \sum_{all\_i} C_{fs}(i,j)}{\sum_{all\_j,all\_i} C_{fd}(i,j) + \sum_{all\_j,all\_i} C_{fs}(i,j) + C_{gnd}} \quad (3)$$

where (i,j)=the location of the pixel formed by the crossing of drive line i and sense line j in the touch sensor panel;

$\sum_{all\_j} C_{fd}(i,j)$ = the sum of all finger to drive line capacitances $C_{fd}$ along drive line i; $\sum_{all\_i} C_{fs}(i,j)$ = the sum of all finger to sense ine capacitances $C_{fs}$ along sense line j;

$\sum_{all\_j,all\_i} C_{fd}(i,j)$ = the sum of all finger to drive ine capacitances $C_{fd}$ in the touch sensor panel;

$\sum_{all\_j,all\_i} C_{fs}(i,j)$ = the sum of all finger to sense line capacitances Cfs in the touch sensor panel; and Cgnd=ground capacitance, which can be a function of the device capacitance and the user's body capacitance, i.e., how well the user is grounded. The right-hand added term in Equation (3) can represent the body capacitance effect.

Equation (3) can be rearranged as follows, $$\Delta C_{sig,a}(i,j) = \Delta C_{sig,m}(i,j) + R \times \sum_{all\_j} \Delta C_{sig,m}(i,j) \times \sum_{all\_i} \Delta C_{sig,m}(i,j), \quad (4)$$

where R=a body capacitance factor, which can be a function of Cfd, Cfs, and Cgnd, thereby representative of a user's body capacitance Cbody;

$\sum_{all\_j} \Delta C_{sig,m}(i,j) =$ the sum of all measured touch signal outputs along drive line i;

and $\sum_{all\_i} \Delta C_{sig,m}(i,j) =$ the sum of all measured touch signal outputs along sense line j.

The body capacitance factor R can be approximated as follows, $$R = a \times \left( \frac{\sum S(j)}{\sum Z_m(j)} \right)_{all\_j}, \quad (5)$$

where a=a touch sensor panel design constant, which can be obtained through simulation and/or empirical measurements for a given panel sensing pattern design; S(j)=a cross product of the finger to sense line capacitances Cfs along the sense lines obtained when a sense line j is stimulated with a stimulation signal Vstm_sc in a stray capacitance configuration; and Zm(j)=an estimated cross product of the finger to sense line capacitances Cfs along the sense lines using the measured touch signal values ΔCsig,m obtained from the sense lines when the drive lines are stimulated in a normal configuration.

The cross product S(j) of the finger to sense line capacitances Cfs can be obtained during stray capacitance mode by stimulating a sense line j of the touch sensor panel with a stimulation signal Vstm_sc and sensing touch outputs on sense line j and a set of k unstimulated sense lines (where k=any number less than or equal to the number of unstimulated sense lines), where the measurement S(j) can be expressed as follows, $$S(j) = \frac{\sum_{all\_i} C_{fs}(i,j) \times \sum_{all\_i, all\_k} C_{fs}(i,k)}{\sum_{all\_j, all\_i} C_{fd}(i,j) + \sum_{all\_j, all\_i} C_{fs}(i,j) + C_{gnd}}. \quad (6)$$

Similarly, the estimated cross product Zm(j) of the finger to sense line capacitances Cfs using the measured touch output values ΔCsig,m can be obtained during normal mode by stimulating the drive lines of the touch sensor panel with a stimulation signal Vstm and sensing touch outputs on sense line j and the set of k other sense lines, where Zm(j) can be expressed as follows, $$Z_m(j) = \sum_{all\_i} C_{fs,m}(i,j) \times \sum_{all\_i, all\_k} C_{fs,m}(i,k) = \quad (7)$$

$$b \sum_{all\_i} \Delta C_{sig,m}(i,j) \times b \sum_{all\_i, all\_k} \Delta C_{sig,m}(i,k),$$

where b=a touch sensor panel design constant, which can be obtained through simulation and/or empirical measurements for a given panel sensing pattern design.

Hence, by obtaining S(j) and Zm(j) and multiplying their sum ratios by the touch sensor panel design constant a as in Equation (5), the body capacitance factor R can be determined. R can then be used to compensate for the body capacitance effect at a pixel, as in Equation (4).

Figure 9:
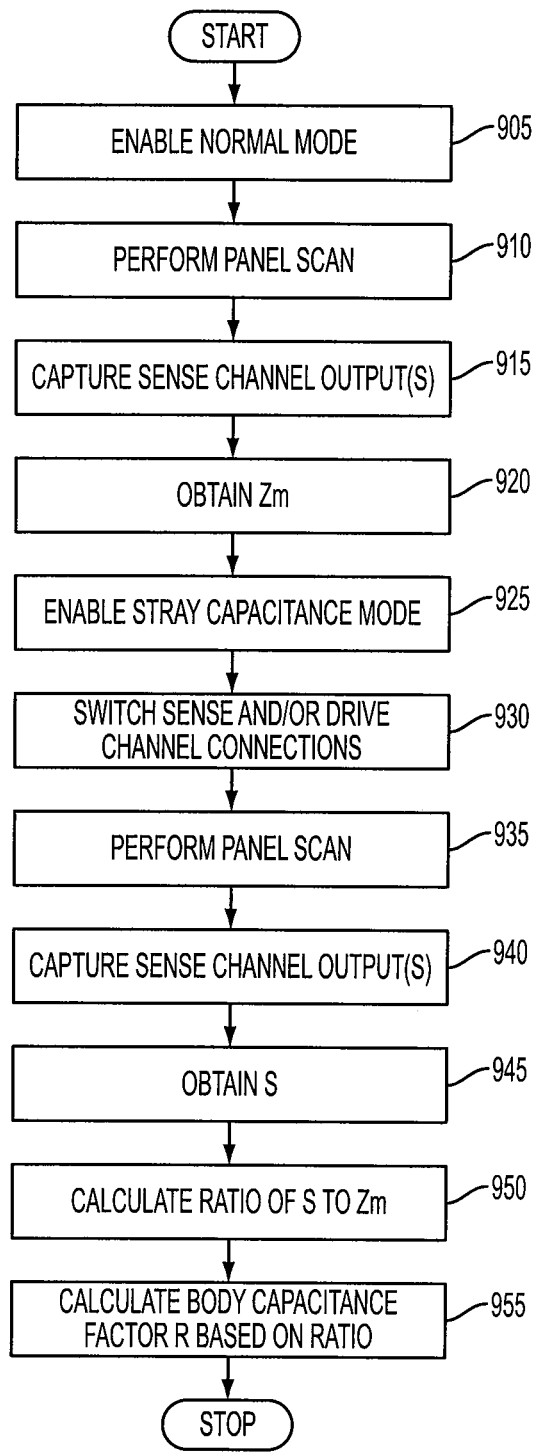
FIG. 9 illustrates an exemplary method for calculating a factor representative of a body capacitance effect according to various embodiments.

FIG. 9 illustrates an exemplary method for measuring body capacitance factor R according to various embodiments. In the example of FIG. 9, normal mode can be enabled (905). During normal mode, the drive channels can output stimulation signals Vstm (e.g., Vstm_p or Vstm_n) and the non-inverting inputs of the sense channels' transimpedence amplifiers can be connected to reference voltage Vref. A touch panel scan can be performed (910). During the scan, the drive lines of the touch sensor panel can be separately or simultaneously stimulated with stimulation signals Vstm from the drive channels, and the sense lines of the panel can output touch signals to the sense channels. The sense channel output(s) can be captured (915). The measurement Zm can be obtained for a particular sense line j (920). For example, the output from the sense channel connected to sense line j and the outputs from k other sense channels connected to k other sense lines can be summed to obtain Zm. Alternatively, the outputs can be averaged to obtain Zm.

Stray capacitance mode can be enabled (925). During stray capacitance mode, the drive channels can connect the touch sensor panel drive lines to either stimulation signals Vstm_sc (e.g., Vstm_sc_p or Vstm_sc_n) or a common voltage Vcm or ground. The non-inverting input of a sense channel's transimpedence amplifier can be connected to the stimulation signal Vstm_sc (e.g., Vstm_Sc_p or Vstm_sc_n) and the remaining sense channels' amplifiers' non-inverting inputs can remain connected to Vref. Alternatively, multiple amplifiers can connect to Vstm_sc. A touch panel scan can be performed (935). During the scan, the sense line of the touch sensor panel connected to the Vstm_sc-inputted sense channel can be stimulated with the stimulation signal Vstm_sc and the remaining sense lines of the panel can output touch signals to the remaining Vref-inputted sense channels. In an alternate embodiment, the drive lines of the touch sensor panel can concurrently be separately or simultaneously stimulated with the stimulation signals Vstm_sc. The sense channel output(s) can be captured (940). The measurement S can be obtained for the stimulated sense line j (945). For example, the output from the sense channel connected to the stimulated sense line j and the outputs from the k other sense channels connected to the k other sense lines can be summed to obtain S. Alternatively, the outputs can be averaged to obtain S.

A ratio T=S(j)/Zm(j) can be calculated (950). A body capacitance factor R can be calculated based on the ratio, as in Equation (5), for example (955). R can then be used to compensate for the body capacitance effect at a pixel. This method can be repeated for each stimulated sense line.

In some embodiments, R can be determined in a stray mode scan performed concurrently with a normal mode scan. In some embodiments, R can be determined in a stray mode scan performed between every normal mode scan. In some embodiments, R can be determined in a stray mode scan performed less frequently, e.g., after a certain consecutive number of normal mode scans.

It is to be understood that determining a body capacitance effect is not limited to the method of FIG. 9, but can include other methods capable of performing according to various embodiments. Although the method of FIG. 9 shows the normal mode and the stray capacitance mode being performed separately, it is to be understood that the two modes can also be performed concurrently or that one mode can be performed one or more times followed by the other mode performed one or more times.

Figure 10:
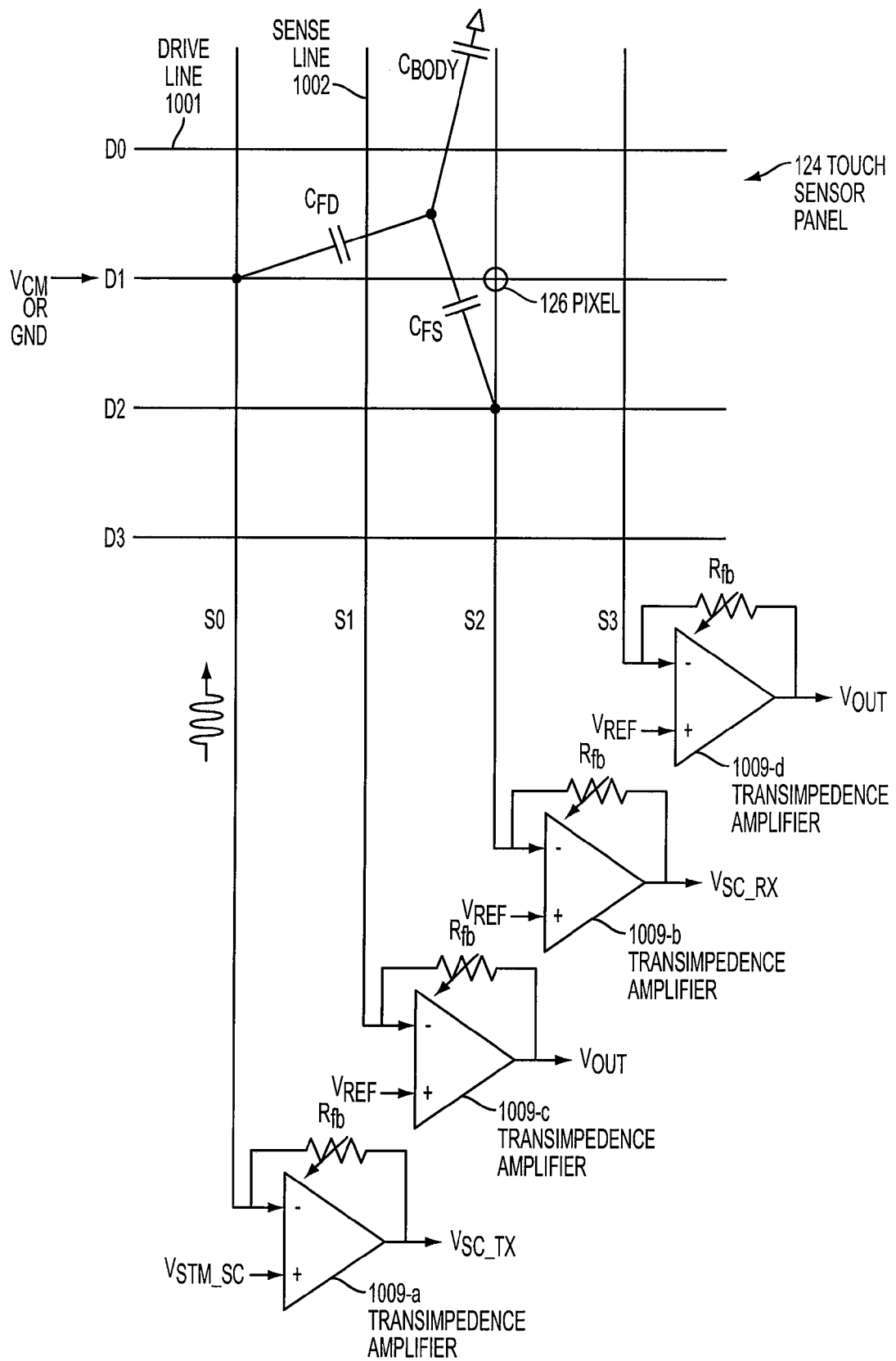
FIG. 10 illustrates exemplary circuitry of a touch sensitive device in stray capacitance mode for measuring an effect of body capacitance according to various embodiments.

FIG. 10 illustrates exemplary circuitry of a touch sensitive device in stray capacitance mode for measuring an effect of body capacitance according to various embodiments. In the example of FIG. 10, touch sensor panel 124 can include drive lines 1001 (D0-D3) and sense lines 1002 (S0-S3) that can form pixels 126. Transimpedence amplifiers 1009 can connect to sense lines 1002 forming sense channels. In stray capacitance mode, the drive lines 1001 can connect to either Vcm or ground. Amplifier 1009-a can be configured as a transmitter by connecting a stimulation signal Vstm_sc to its non-inverting input. Amplifiers 1009-b, 1009-c, and 1009-d can be configured as receivers by connecting a reference signal Vref to their non-inverting inputs. Amplifier 1009-a can stimulate sense line S0 with the same stimulation signal Vstm_sc present on its non-inverting input. The output voltage Vsc_tx from the amplifier 1009-a can be a function of the stray capacitance on the sense line S0.

In this example, when a user's hand contacts pixels D1,S0 and D2,S2, a signal charge can be transferred from stimulated sense line S0 through the finger contacting pixel D1,S0, the finger contacting pixel D2,S2, into sense line S2, via capacitances Cfd and Cfs. The amount of signal charge transferred can be a function of the user's body capacitance Cbody. The output voltage Vsc_tx from the amplifier 1009-b (connected to sense line S2) can be a function of the amount of charge transferred through the user's hand and therefore a function of the user's body capacitance Cbody.

Normally, contacting the pixel D2,S2 can cause a reduction in signal level at amplifier 1009-b. However, due to the charge transfer from pixel D1,S0 to pixel D2,S2, the signal can actually increase, hence, a negative pixel.

The outputs Vsc_tx and Vsc_rx can be measured (e.g., measurement S previously described) and used to determine the body capacitance factor R.

Figure 11:
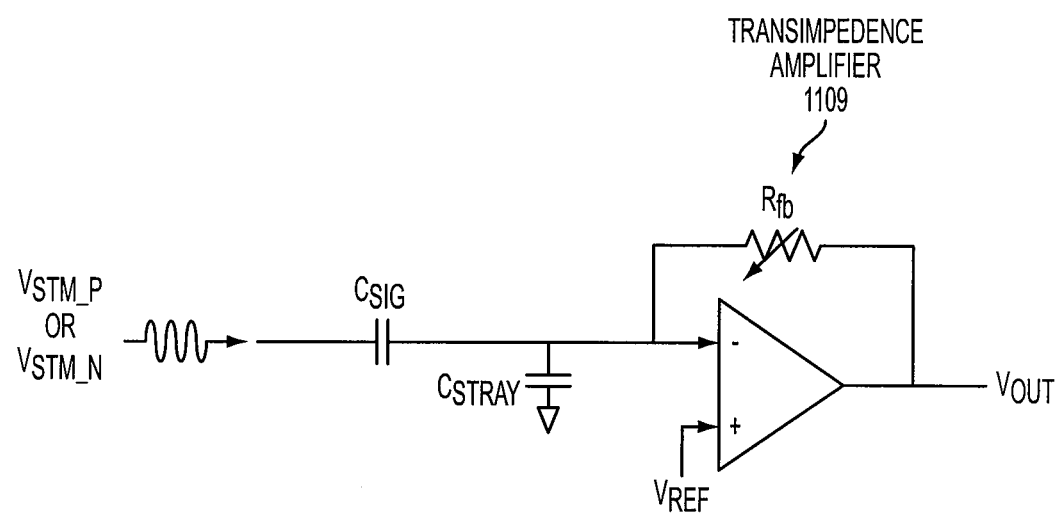
FIG. 11 illustrates an exemplary circuit in normal mode for detecting a capacitive touch according to various embodiments.

FIG. 11 illustrates an exemplary circuit in normal mode for detecting a capacitive touch according to various embodiments. In the example of FIG. 11, transimpedence amplifier 1109 of a sense channel in receive section 107 can receive a stable reference voltage Vref at the non-inverting input of the amplifier and can receive a stimulation signal Vstm run through a mutual capacitance Csig via touch sensor panel 124 at the inverting input of the amplifier. The amplifier 1109 can output voltage Vout, which can be indicative of a touch at the panel.

Figure 12:
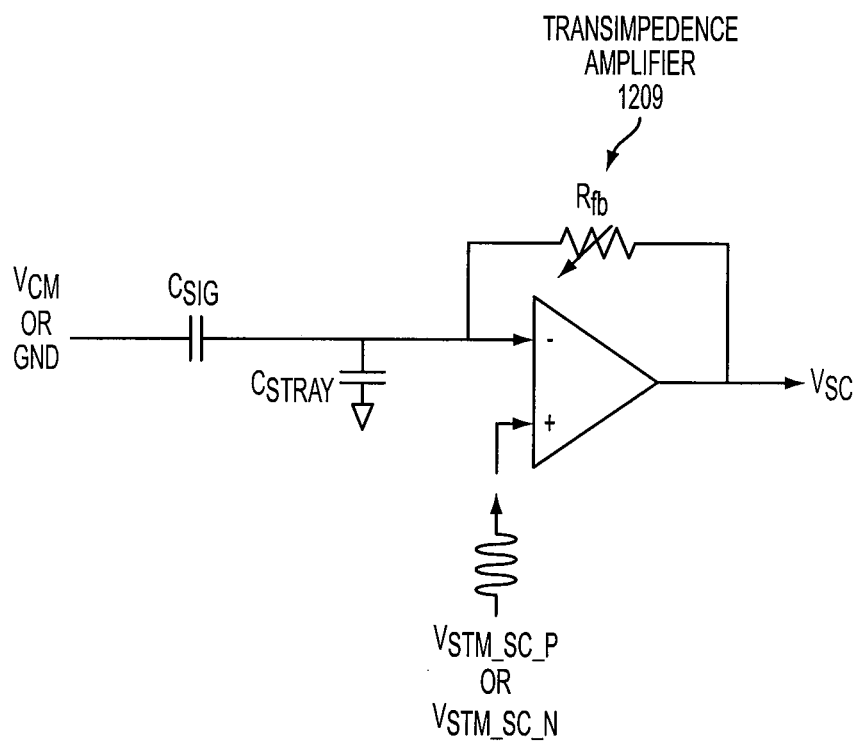
FIG. 12 illustrates an exemplary circuit in stray capacitance mode for measuring an effect of body capacitance according to various embodiments.

FIG. 12 illustrates an exemplary circuit in stray capacitance mode for measuring body capacitance according to various embodiments. In the example of FIG. 12, transimpedence amplifier 1209 of a sense channel in receive section 107 can receive a stimulation signal Vstm_sc at the non-inverting input of the amplifier, while the drive lines can be held at Vcm or ground. Therefore, Csig can become part of Cstray present at the inverting input of the amplifier 1209. In some embodiments, the stimulation signal Vstm_sc can have an arbitrary wave shape, e.g., a sine wave, a ramped square wave, etc., with or without envelope shaping. In stray capacitance mode, the output voltage Vsc can be a function of Cstray, Rfb, and the stimulation signal Vstm_sc frequency. If the amplifier 1209 operates in a linear operating range, the amplifier can keep both inverting and non-inverting inputs at the same or similar voltage levels. As such, the stimulation signal Vstm_sc can also be present on the sense line connecting to the inverting input and the amplifier 1209 can drive the sense line. In some embodiments, the amplitude and frequency of Vstm_sc can be programmable and the feedback resistor Rfb can be programmable. Stimulation signal frequencies can be selected, e.g., so as to avoid environmental noise being injected into the sense lines. Noise injection can occur, for example, through one or more touching object, such as fingers, via a noise coupling capacitor (not shown). The amplifier 1209 can output voltage Vsc, which can be indicative of a touching user's body capacitance.

During the stray capacitance mode, the touch sensor panel can be scanned in steps, where each step can apply a stimulation signal Vstm_sc to one or more of the sense channels and the output of the sense channels can be captured. The number of steps can vary, generally up to the number of sense channels, depending on the number of sense channel outputs deemed sufficient to measure the body capacitance effect. After all the steps are completed, the outputs can be processed to determine the body capacitance effect. In some embodiments, each step can apply a stimulation signal Vstm_sc to a different one of the sense channels and the outputs of the sense channels can be captured. The output from a sense channel can be a signal whose amplitude is the stimulation signal Vstm amplitude scaled by the gain (e.g., $\sqrt{1+(\omega_{STM} \cdot R_{fb} \cdot C_{STRAY})^2}$) of the transimpedence amplifier. In some embodiments, the gain value can be adjusted per step and per sense channel. As such, a gain lookup table (LUT) can be stored in memory of the touch controller to access gain values to apply to the sense channels during each step of the body capacitance mode scan. In some embodiments, the gain values can be scaled based on the frequency of the stimulation signal Vstm used during normal mode.

In some embodiments, all of the sense channels can connect to Vcm or ground through the inverting inputs of their amplifiers, one of the sense channels can connect to Vstm_sc through the non-inverting input of its amplifier, and the remainder of the sense channels can connect to Vref through the non-inverting inputs of their amplifiers. As such, the one sense channel can become a drive channel and the remaining sense channels can remain as sense channels that can receive output from the touch sensor panel 124 for measuring an effect of body capacitance.

In some embodiments, multiple sense channels can connect to Vstm_sc through their non-inverting inputs of their amplifiers to become drive channels and the remaining sense channels can connect to Vref through their non-inverting inputs of their amplifiers to remain sense channels. The Vstm_sc-inputted sense channels can alternate with the Vref-inputted sense channels in a layout. Or the Vstm_sc-inputted sense channels can be grouped together and the V-ref inputted sense channels can be grouped together in a layout. Other layouts can also be used, depending on the needs of the device.

In some embodiments, the amount of charge that is transferred from a Vstm_sc-inputted sense channel to a Vref-inputted sense channel can be detected. Based on the amount of detected charge, a flag can be raised to indicate a poor grounding condition. For example, a charge threshold could be set for each sense channel and compared to the detected charge. The detected charge exceeding the charge threshold for the Vref-inputted sense channels can raise the flag to indicate poor grounding. The flag can be used to trigger compensation of negative capacitance.

In some embodiments, the stray capacitance mode can be used to detect a touch condition. If a finger touches a sense line, a stray capacitance of ΔCstray can be added to that sense line. Accordingly, after a scan of the touch sensor panel, the outputs of the sense channels can be summed and compared to a stray capacitance threshold. For example, the summed output exceeding the threshold can indicate a touch on the touch sensor panel so that normal mode can be enabled, the drive and sense lines switched to normal mode configuration, and the processor and other components woken up to further process touch signals. Conversely, the summed output below the threshold can indicate no touch on the touch sensor panel so that the processor and other components can remain inactive. This can be a power-saving measure.

Figure 13:
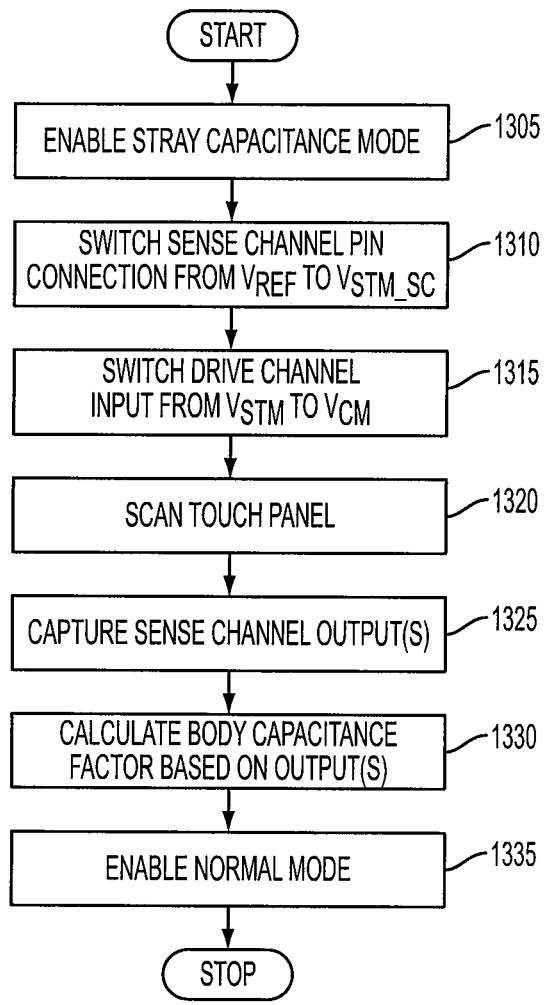
FIG. 13 illustrates an exemplary method for measuring an effect of body capacitance according to various embodiments.

FIG. 13 illustrates an exemplary method for measuring an effect of body capacitance according to various embodiments. In the example of FIG. 13, a stray capacitance mode can be enabled (1305). The non-inverting input pins on one or more sense channel(s) can be switched from connections to Vref to connection to Vstm_sc (1310). The drive signals outputted by the drive channels to the touch sensor panel can be switched from Vstm to Vcm (or ground) (1315). The touch sensor panel can be scanned to generate touch signals that can be processed by the sense channels (1320). The processed touch signals outputted by the sense channels can be captured (1325). Body capacitance factor R can be calculated (as in Equation (5)) based on, for example, the measurement Zm obtained from the sense channel outputs and the measurement S obtained from a preceding normal mode scan (1330). R can be stored for further processing. Normal mode can be enabled (1335).

Figure 14:
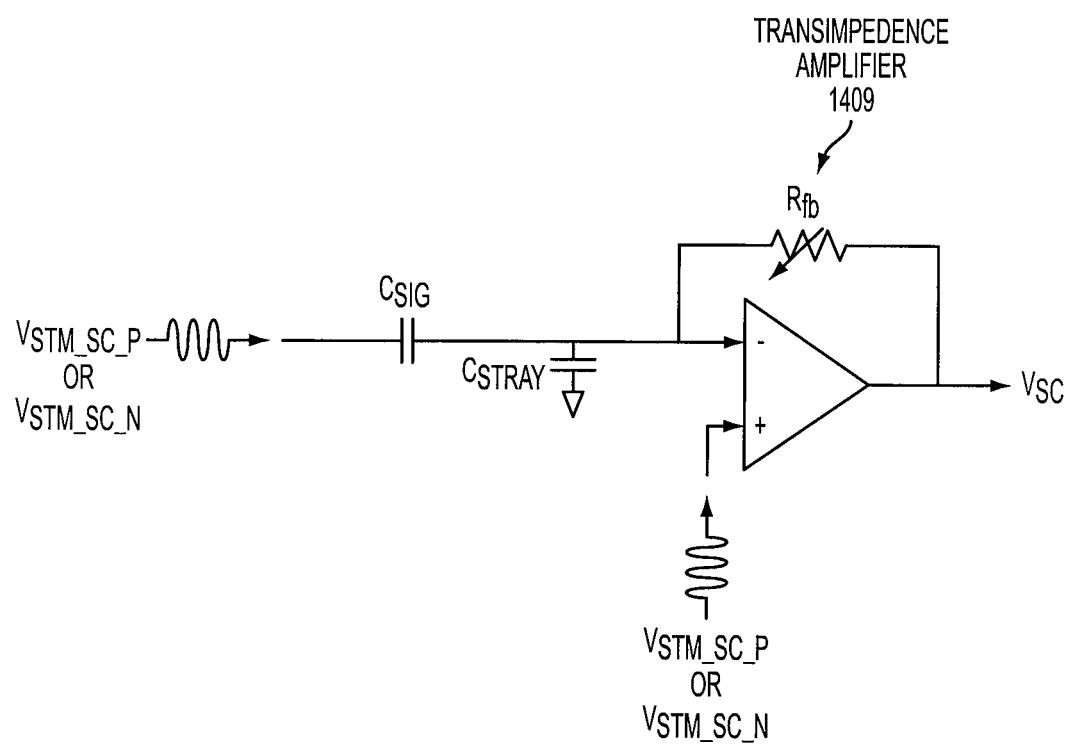
FIG. 14 illustrates another exemplary circuit in stray capacitance mode for measuring an effect of body capacitance according to various embodiments.

FIG. 14 illustrates another exemplary circuit in stray capacitance mode for measuring body capacitance according to various embodiments. In the example of FIG. 14, transimpedence amplifier 1409 of a sense channel can receive a stimulation signal Vstm_sc at the non-inverting input of the amplifier while the drive lines can be stimulated with the stimulation signal Vstm_sc, which can run through a mutual capacitance Csig via touch sensor panel 124 at the inverting input of the amplifier. The amplifier 1109 can output voltage Vsc, which can be indicative of a body capacitance.

When the drive lines are connected to Vcm (or to ground) as in FIG. 12, the capacitance Csig formed between the drive lines and a crossing sense line can contribute to the total stray capacitance Cstray on the sense line, which can be a function of Cs, the capacitance of the sense line to ground; Csig, the mutual capacitance between the drive lines and the sense line; and the number of drive lines Nrows intersecting the sense line. When a user's finger touches a pixel on the sense line, the sense line capacitance can change based on the finger to sense capacitance Cfs and the user's body capacitance Cbody.

Therefore, the dynamic range utilization Dsc of a capacitance measurement at the sense line can be expressed as a function of Cstray, Cfs, Cbody, Csig, and Nrows as follows.

$$D_{sc} = k \log\left(\frac{C_{fs} \| C_{body}}{C_s + N_{ROWS} \cdot C_{sig}}\right), \quad (8)$$

where k can be a constant, typically 20, associated with a voltage ratio or a power ratio. In some embodiments, the dynamic range utilization Dsc can be a function of a constant k' (typically 10) times the log of a squared term, such as the square of the log term in Equation (8).

The numerator of Equation (8) can represent the capacitance change of a given sense line due to an object, e.g., a finger, touching above the sense line. The denominator of Equation (8) can represent the total sense line stray capacitance. The denominator term $N_{ROWS} \cdot C_{sig}$ can represent the mutual capacitance (Csig) contribution of the total number Nrows of pixels on a given sense line to the overall stray capacitance of the sense line. For example, suppose Csig=1.3 pF, Cfs=1 pF, Cs=25 pF, Cbody>>Cfs, and Nrows=15. The dynamic component ΔCstray can undesirably be −33 dB down from the full scale value of Vsc as shown in FIG. 12, for example, resulting in lower signal-to-noise ratio. To increase the dynamic range utilization and thereby the signal-to-noise ratio, the drive lines can be modulated with Vstm_sc, as shown in FIG. 14, for example, such that the mutual capacitance Csig can be canceled out and drop to zero. As such, the $N_{ROWS} \cdot C_{sig}$ term can drop out of Equation (8) and the total dynamic range utilization Dsc of the sense channel can become, for example, $$D_{sc} = k \log\left(\frac{C_{fs} \| C_{body}}{C_s}\right). \quad (9)$$

Accordingly, in this example, the dynamic range utilization can improve approximately 5 dB over the previous case. The amount of improvement can depend on the given application and can be more or less than 5 dB.

In some embodiments, all the drive channels can output Vstm_sc. In some embodiments, one or more of the drive channels can output Vstm_sc and the remainder can output Vcm. In some embodiments, one of the sense channels can connect to Vstm_sc through the non-inverting input of its amplifier and the remaining sense channels can connect to Vref through the non-inverting inputs of their amplifiers. In some embodiments, multiple sense channels can connect to Vstm_sc through the non-inverting inputs of their amplifiers to become drive channels and the remaining sense channels can connect to Vref through the non-inverting inputs of their amplifiers to remain receive channels. The Vstm_sc-inputted sense channels can alternate with the Vref-inputted sense channels in a layout. Or the Vstm_sc-inputted sense channels can be grouped together and the Vref-inputted sense channels can be grouped together in a layout. Other layouts can also be used, depending on the needs of the device.

Figure 15:
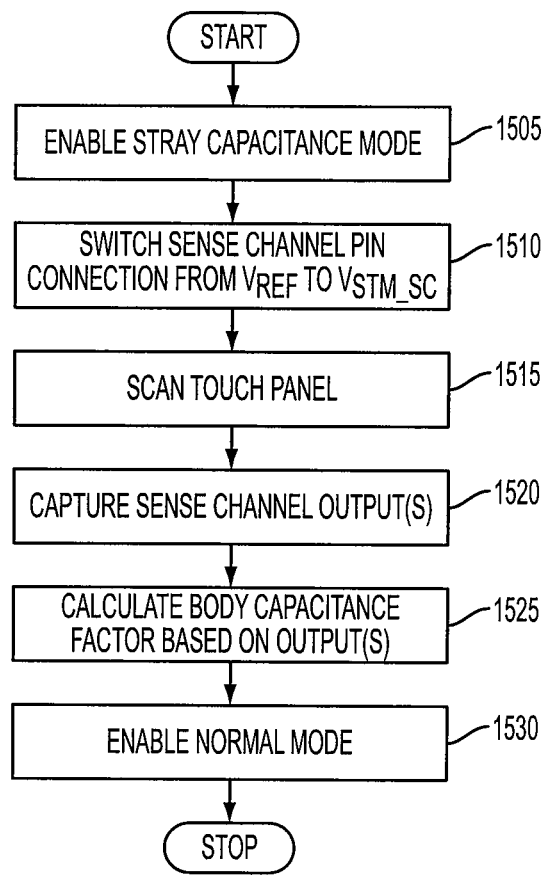
FIG. 15 illustrates another exemplary method for measuring an effect of body capacitance according to various embodiments.

FIG. 15 illustrates an exemplary method for measuring an effect of body capacitance according to various embodiments. In the example of FIG. 15, a stray capacitance mode can be enabled (1505). The non-inverting input pins on one or more sense channel(s) can be switched from connections to Vref to connection to Vstm_sc (1510). The drive channels can be switched to connect to Vstm_sc. The touch sensor panel can be scanned to generate touch signals that can be processed by the sense channels (1515). The processed touch signals outputted by the sense channels can be captured (1520). Body capacitance factor R can be calculated (as in Equation (5)) based on, for example, the measurement Zm obtained from the sense channel outputs and the measurement S obtained from a preceding normal mode scan (1525). R can be stored for further processing. Normal mode can be enabled (1530).

Figure 16:
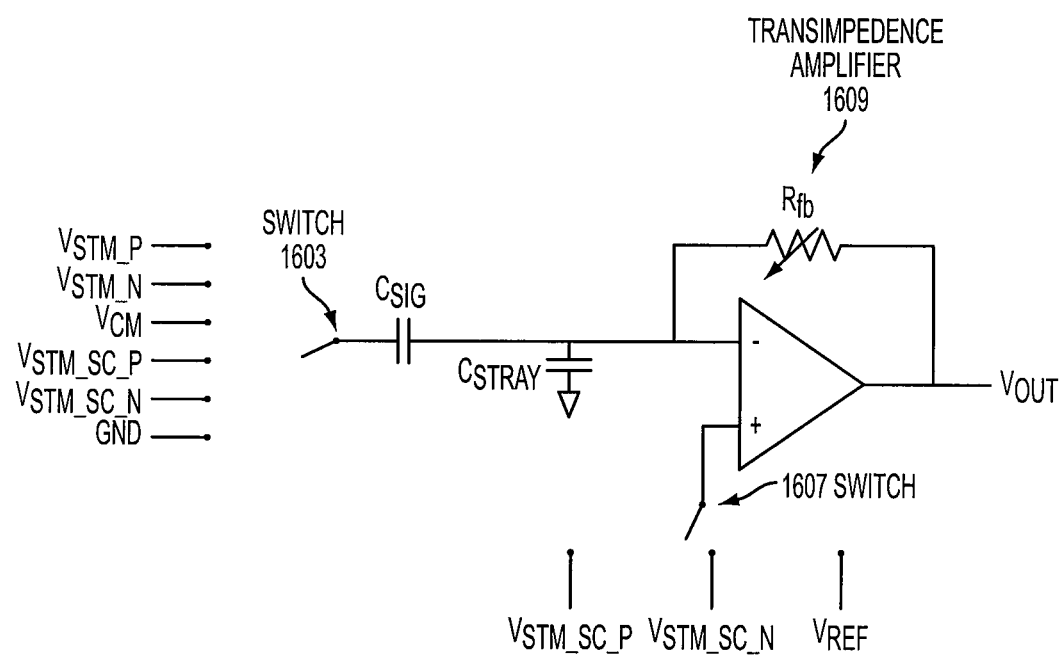
FIG. 16 illustrates an exemplary circuit switchable between normal mode and stray capacitance mode according to various embodiments.

FIG. 16 illustrates an exemplary circuit switchable between normal mode and stray capacitance mode according to various embodiments. In the example of FIG. 16, switch 1603 can switch between a stimulation signal Vstm_n or Vstm_p, a common voltage signal Vcm, or ground gnd during normal mode and between a stimulation signal Vstm_sc_p or Vstm_sc_n, a common voltage signal Vcm, or ground gnd, during stray capacitance mode, outputted by the drive channels of the transmit section 114. Switch 1607 can switch the non-inverting input of transimpedence amplifier 1609 between a stimulation signal Vstm_sc_p or Vstm_sc_n, during stray capacitance mode, and a reference voltage signal Vref, during normal mode.

Figure 17:
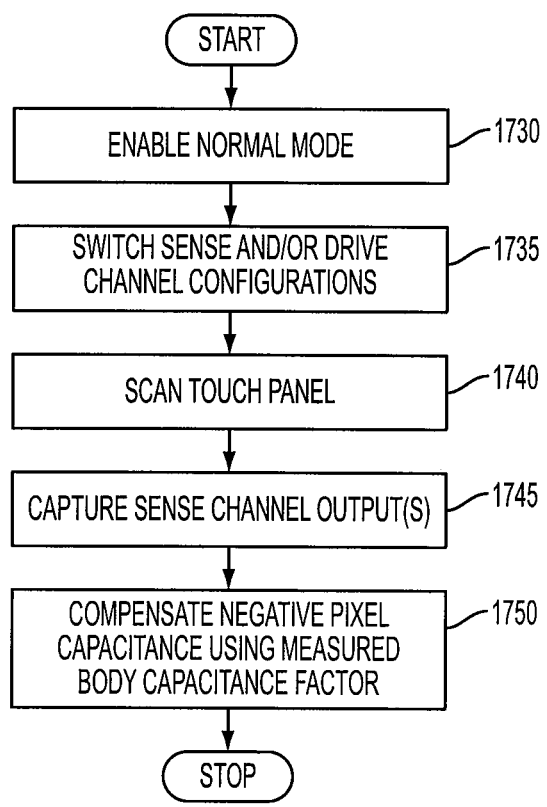
FIG. 17 illustrates an exemplary method for using a measured effect of body capacitance to compensate for negative capacitance according to various embodiments.

FIG. 17 illustrates an exemplary method for using a measured effect of body capacitance to compensate for negative capacitance according to various embodiments. In the example of FIG. 17, a normal mode can be enabled (1730). The sense and/or drive channel configurations of a previous stray capacitance mode can be switch to their appropriate configurations during normal mode (1735). The touch sensor panel can be scanned to generate touch signals that can be processed by the sense channels (1740). The processed touch signals outputted by the sense channels can be captured (1745). Negative capacitance at the pixels can be compensated for in the outputs (as in Equation (4)) based on a previously determined body capacitance factor R (e.g., as illustrated in FIG. 9) (1750).

In some embodiments, the touch sensitive device can perform the stray capacitance mode and the normal mode concurrently, using a newly calculated body capacitance factor R with the touch signals. In some embodiments, the touch sensitive device can switch between the stray capacitance mode and the normal mode for each scan, using the calculated body capacitance factor R with the touch signals from each normal mode scan. In some embodiments, the device can switch to the stray capacitance mode after a certain number of normal mode scans, using the same calculated body capacitance factor R with the touch signals from multiple normal mode scans.

Figure 18:
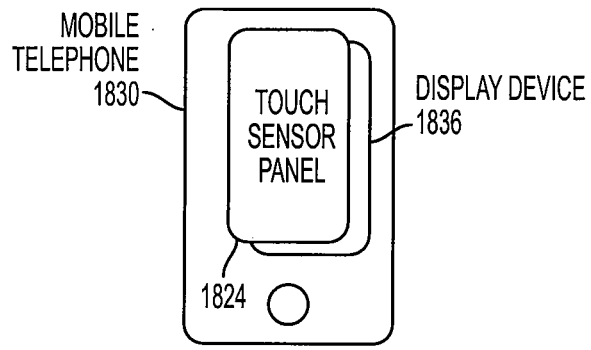
FIG. 18 illustrates an exemplary mobile telephone that can measure a body capacitance effect according to various embodiments.

FIG. 18 illustrates an exemplary mobile telephone 1830 that can include touch sensor panel 1824, display 1836, and other computing system blocks that can measure an effect of body capacitance according to various embodiments.

Figure 19:
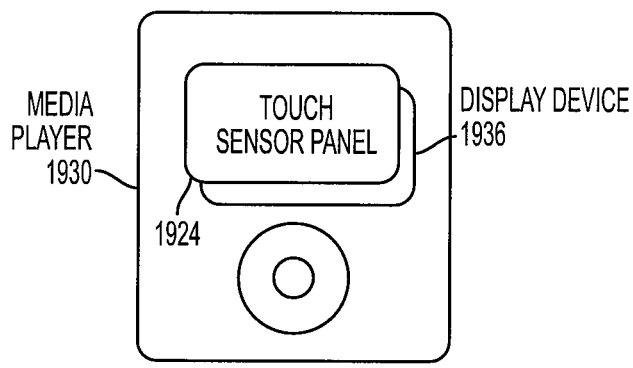
FIG. 19 illustrates an exemplary digital media player that can measure a body capacitance effect according to various embodiments.

FIG. 19 illustrates an exemplary digital media player 1930 that can include touch sensor panel 1924, display 1936, and other computing system blocks that can measure an effect of body capacitance according to various embodiments.

Figure 20:
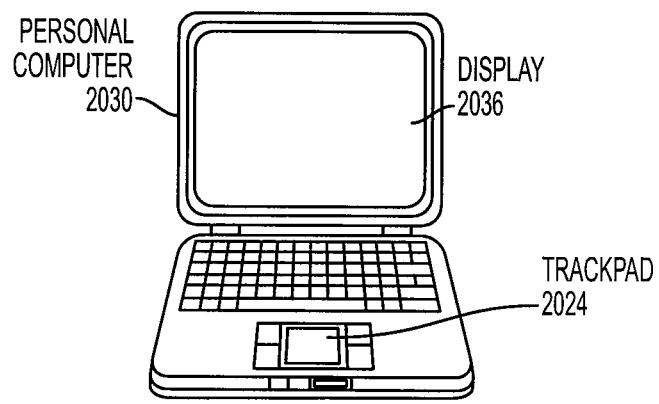
FIG. 20 illustrates an exemplary personal computer that can measure a body capacitance effect according to various embodiments.

FIG. 20 illustrates an exemplary personal computer 2030 that can include touch sensor panel (trackpad) 2024, display 2036, and other computing system blocks that can measure an effect of body capacitance according to various embodiments.

The mobile telephone, media player, and personal computer of FIGS. 18 through 20 can realize power savings, improved accuracy, faster speed, and more robustness by measuring a body capacitance effect according to various embodiments.

Although embodiments have been fully described with reference to the accompanying drawings, it is to be noted that various changes and modifications will become apparent to those skilled in the art. Such changes and modifications are to be understood as being included within the scope of the various embodiments as defined by the appended claims.

What is claimed is:

1. A method comprising:
   enabling a mode for measuring a body capacitance effect in a touch sensor panel couplable to a sense channel and a drive channel;
   switching the sense channel from a reference signal input to a stimulation signal input;
   capturing outputs of the sense channel comprising signals from the touch sensor panel; and
   determining the body capacitance effect based on the captured outputs wherein determining the body capacitance effect includes determining a body capacitance component of the captured outputs indicative of an amount of body capacitance associated with an object proximate to the panel.

2. The method of claim 1, further comprising:
   determining whether the captured signals indicate poor object grounding; and
   generating an indicator based on the determination.

3. The method of claim 1, further comprising:
   programmably scaling the stimulation signal input to the sense channel.

4. The method of claim 1, further comprising:
   receiving at the drive channel the stimulation signal input, the received drive channel input configured to compensate for a capacitance formed at the panel.

5. The method of claim 1, further comprising:
   transmitting the stimulation signal input downstream of the sense channel, the transmitted stimulation signal configured to improve a dynamic range of the sense channel.

6. The method of claim 1, further comprising:
   subtracting the stimulation signal input from the captured outputs in order to at least one of increase a dynamic range of the captured outputs or increase a signal-to-noise ratio of the captured outputs.

7. The method of claim 1, further comprising:
   subtracting the stimulation signal input from the captured outputs in order to reduce a dependency of the captured outputs on a frequency-dependent phase shift of the stimulation signal input.

8. An apparatus comprising:
   a touch sensor panel couplable to a sense channel and a drive channel; and
   one or more processors configured to:
   enable a mode for measuring a body capacitance effect in the touch sensor;
   switch the sense channel from a reference signal input to a stimulation signal input;
   capture outputs of the sense channel comprising signals from the touch sensor panel; and
   determine the body capacitance effect based on the captured outputs, wherein determining the body capacitance effect includes determining a body capacitance component of the captured outputs indicative of an amount of body capacitance associated with an object proximate to the panel.

9. The apparatus of claim 8, the processor further configured to:
   determine whether the captured signals indicate poor object grounding; and
   generate an indicator based on the determination.

10. The apparatus of claim 8, the processor further configured to:
    programmably scale the stimulation signal input to the sense channel.

11. The apparatus of claim 8, the processor further configured to:
    receive at the drive channel the stimulation signal input, the received drive channel input configured to compensate for a capacitance formed at the panel.

12. The apparatus of claim 8, the processor further configured to:
    transmit the stimulation signal input downstream of the sense channel, the transmitted stimulation signal configured to improve a dynamic range of the sense channel.

13. The apparatus of claim 8, the processor further configured to:
    subtract the stimulation signal input from the captured outputs in order to at least one of increase a dynamic range of the captured outputs or increase a signal-to-noise ratio of the captured outputs.

14. The apparatus of claim 8, the processor further configured to:
    subtract the stimulation signal input from the captured outputs in order to reduce a dependency of the captured outputs on a frequency-dependent phase shift of the stimulation signal input.

* * * * *